(12) United States Patent
Lee

(10) Patent No.: US 7,057,656 B2
(45) Date of Patent: Jun. 6, 2006

(54) PIXEL FOR CMOS IMAGE SENSOR HAVING A SELECT SHAPE FOR LOW PIXEL CROSSTALK

(75) Inventor: Do-Young Lee, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 700 days.

(21) Appl. No.: 09/780,682

(22) Filed: Feb. 8, 2001

(65) Prior Publication Data

US 2002/0008767 A1   Jan. 24, 2002

Related U.S. Application Data

(60) Provisional application No. 60/182,044, filed on Feb. 11, 2000.

(51) Int. Cl.
*H04N 3/14* (2006.01)

(52) U.S. Cl. ........................ 348/308; 348/340; 247/291

(58) Field of Classification Search ................ 348/308, 348/315, 374, 340
See application file for complete search history.

(56) References Cited

U.S. PATENT DOCUMENTS 5,595,930 A * 1/1997 Baek ........................... 438/60
5,986,297 A * 11/1999 Guidash et al. ............. 257/223
6,633,334 B1 * 10/2003 Sakurai et al. .............. 348/308

OTHER PUBLICATIONS

Yang, et al. "An Integrated 800x600 CMOS Imaging System", Feb. 15-17, 1999, IEEE Solid State Circuits Conference, Session 17, Digest of Techinical Papers, pp. 304-304 and 471.*

* cited by examiner

*Primary Examiner*—Ngoc-Yen Vu
*Assistant Examiner*—Gary C. Vieaux
(74) *Attorney, Agent, or Firm*—Townsend and Townsend and Crew LLP

(57) ABSTRACT

A novel CMOS image unit pixel layout having a photodiode including an optically optimized square image sensing region. The square image sensing layout provides for reduced electrical and color crosstalk and improved modulation transfer function (MTF) between neighboring pixels of an array of pixels.

9 Claims, 5 Drawing Sheets

PIXEL FOR CMOS IMAGE SENSOR HAVING A SELECT SHAPE FOR LOW PIXEL CROSSTALK

CROSS-REFERENCE TO RELATED APPLICATIONS

This non-provisional patent application claims priority from provisional U.S. Patent Application No. 60/182044, filed Feb. 11, 2000, which is incorporated by reference into this application for all purposes.

BACKGROUND OF THE INVENTION

The present invention relates generally to image sensing technology. More specifically, the present invention relates to a CMOS image sensor having a novel layout that uses specially-matched microlenses.

Traditionally, imaging technology has been centered around charge coupled device (CCD) image sensors. However, recently, CMOS imaging technology has become increasingly the technology of choice. There are a variety of reasons for this progression. First, CCD imagers require specialized facilities, which are dedicated exclusively to the fabrication of CCDs. Second, CCD imagers consume a substantial amount of power, since they are essentially capacitive devices, which require external control signals and large clock swings to achieve acceptable charge transfer efficiencies. Third, CCD imagers require several support chips to operate the device, condition the image signal, perform post processing and generate standard video output. This need for additional support circuitry makes CCD systems complex. Finally, CCD systems require numerous power supplies, clock drivers and voltage regulators, which not only further increase the complexity of the design, but also demands the consumption of additional significant amounts of power.

By contrast, CMOS imagers are characterized by a less complex design. The more simple architecture translates into a reduction in engineering and production costs and a concomitant and substantial reduction in power consumption. With today's sub-micron CMOS fabrication processes, CMOS imagers have also become highly integrated. For example, an entire CMOS-based imaging system, such as a digital camera, can be fabricated on a single semiconductor chip. Additionally, unlike CCD imagers, CMOS imagers are amenable to fabrication in standard CMOS fabrication facilities. This adaptability significantly reduces plant overhead costs. For these reasons, CMOS imagers are swiftly becoming the imagers of choice.

An image sensor is comprised of an array of picture elements or "pixels." A layout for an exemplary CMOS unit pixel 10 is shown in FIG. 1. Unit pixel 10 is comprised of a rectangular image sensing area 100, transfer transistor 102, floating node 104, reset transistor 106, drive transistor 108, select transistor 110 and output 112. Unit pixel 10 is powered by power supply VDD 114. Image sensing area 100 is made rectangular to maximize the "fill factor," which is defined as the percentage of the unit pixel 10 area occupied by image sensing area 100. A typical fill factor for the arrangement of FIG. 1 is approximately 30%.

Referring now to FIG. 2, there is shown a plan view of a partial array of pixels 20, according to conventional CMOS image sensor devices. By positioning hemiscylindrically-shaped microlenses 203 over image sensing areas 200, the effective fill factor for the layout of FIG. 1 can be improved, as incident light 204 is focused more towards the center of rectangular image sensing areas 200 by microlenses 203. The percentage of each unit pixel 20 occupied by each image sensing area 200 does not, of course, change by employment of microlenses 203. Nevertheless, light capture is improved and the effective fill factor is increased. Use of hemiscylindrically-shaped microlenses 203 can increase the effective fill factor to approximately 75%.

Despite the improvement in effective fill factor using hemicylindrically-shaped microlenses, there are negative performance factors, which are attributable to use of rectangular-shaped image sensing areas and hemicylindrically-shaped microlenses.

First, referring to FIG. 2, whereas utilization of hemicylindrically-shaped microlenses 203 is effective at directing incident light 204 arriving at angles perpendicular to the major axes (major axes are in x-direction) of the lenses 203, the hemicylindrically-shaped microlenses 203 are not very effective at focusing incident light 204 arriving at angles non-perpendicular to, i.e. oblique to, the major axes of the hemicylindrically-shaped microlenses 203. This ineffectiveness further involves light that is scattered and/or reflected and which ultimately arrives at the lenses 203 at oblique angles.

The ineffectiveness of hemicylindrically-shaped microlenses 203 to focus incident light towards the center of the image sensing areas 200 is problematic due to the fact that neighboring rectangular-shaped image sensing areas are in close proximity in the x-direction See FIG. 2, where the horizontal spacing between neighboring pixels is shown to be approximately 0.8 µm. The close proximity results in random diffusion of photocharge generated outside the photodiode depletion regions. Photocharge that is generated outside the depletion region of a particular pixel is prone to capture by a neighboring pixel. When photocharge is unwantedly captured by an adjacent pixel, electrical crosstalk occurs resulting in a reduction in image sharpness.

There is another type of crosstalk that can be attributed to the close proximity of neighboring rectangular-shaped image sensing areas 200. This second type of crosstalk occurs between pixels of different colors and is referred to in the art as "color crosstalk." Color crosstalk leads to color distortion and is caused by the fact that silicon-based photodiodes have a wavelength-dependent photon absorption response. In particular, color distortion can be significant for image arrays that use rectangular-shaped image sensing areas together with an RGB Bayer pattern color filter. In fact, a difference on the order of 10% in the response of $G_R$ (green pixels adjacent red pixels) and $G_B$ (green pixels adjacent blue pixels), under uniform illumination, is observed when rectangular-shaped image sensing areas are used. This difference in green pixel responsivity results in color distortion.

Finally, yet another problem that is observed when neighboring image sensing areas are too closely positioned, is a decrease in spatial resolution. In imaging systems, resolution is quantified in terms of a modulation transfer function (MTF). The lower the MTF, the less capable an imaging device is at picking up the fine detail and contrast in the object that is being imaged.

The above problems associated with use of rectangular-shaped image sensing areas 200 and hemicylindrically-shaped microlenses 203 are further discussed in a paper entitled *An Improved Digital CMOS Imager*, presented at the 1999 IEEE Workshop on Charge-Coupled Devices and Advanced Image Sensors on Jun. 10–12, 1999. This paper is hereby incorporated by reference.

Based on the foregoing deficiencies associated with currently available CMOS imagers, what is needed is a new CMOS imager characterized by low electrical and optical pixel-to-pixel crosstalk, high effective fill factor, and high MTF. The present invention fulfills these needs by providing a CMOS imager having a novel unit pixel layout using specially matched microlenses.

SUMMARY OF THE INVENTION

In a first aspect of the present invention, a CMOS pixel for use in a CMOS imager is provided, and, comprises a photodiode having a square-shaped image sensing area, a transfer transistor for delivering photogenerated charge to an output of the CMOS pixel, a reset transistor for initiating the photogeneration and collection process and a source follower for transferring the transferred charge to the pixel output.

Use of a square image sensing area increases the distance between image sensing areas of adjacent pixels. This leads to a reduction in electrical and color crosstalk and improves the modulation transfer function (MTF).

In a second aspect of the invention, hemispherically-shaped microlenses are positioned over the image sensing areas of each CMOS pixel, to increase the effective fill factor of each pixel.

In one embodiment of the present invention, an array of CMOS pixels is provided, each pixel comprising a square image sensing region such that the distance between image sensing regions of neighboring pixels is optimized to reduce crosstalk between the neighboring pixels.

In another embodiment of the present invention, a CMOS pixel for use in a CMOS imager, comprises: a. a photodiode having a substantially square-shaped image sensing area, an anode coupled to ground and a cathode; b. a transfer transistor having a drain coupled to the cathode of the photodiode, a gate controlled by a control signal, Tx, and a source coupled to a floating sensing node; c. a reset transistor having a drain coupled to VDD, a gate controlled by a control signal, Rx, and a source coupled to the floating sensing node; and d. a source follower coupled between the floating node and an output of the unit pixel, the source follower controlled by a select signal.

A better understanding of the nature and advantages of the present invention may be gained with reference to the detailed description below, the drawings and the appended claims.

DESCRIPTION OF THE SPECIFIC EMBODIMENTS

Figure 3:
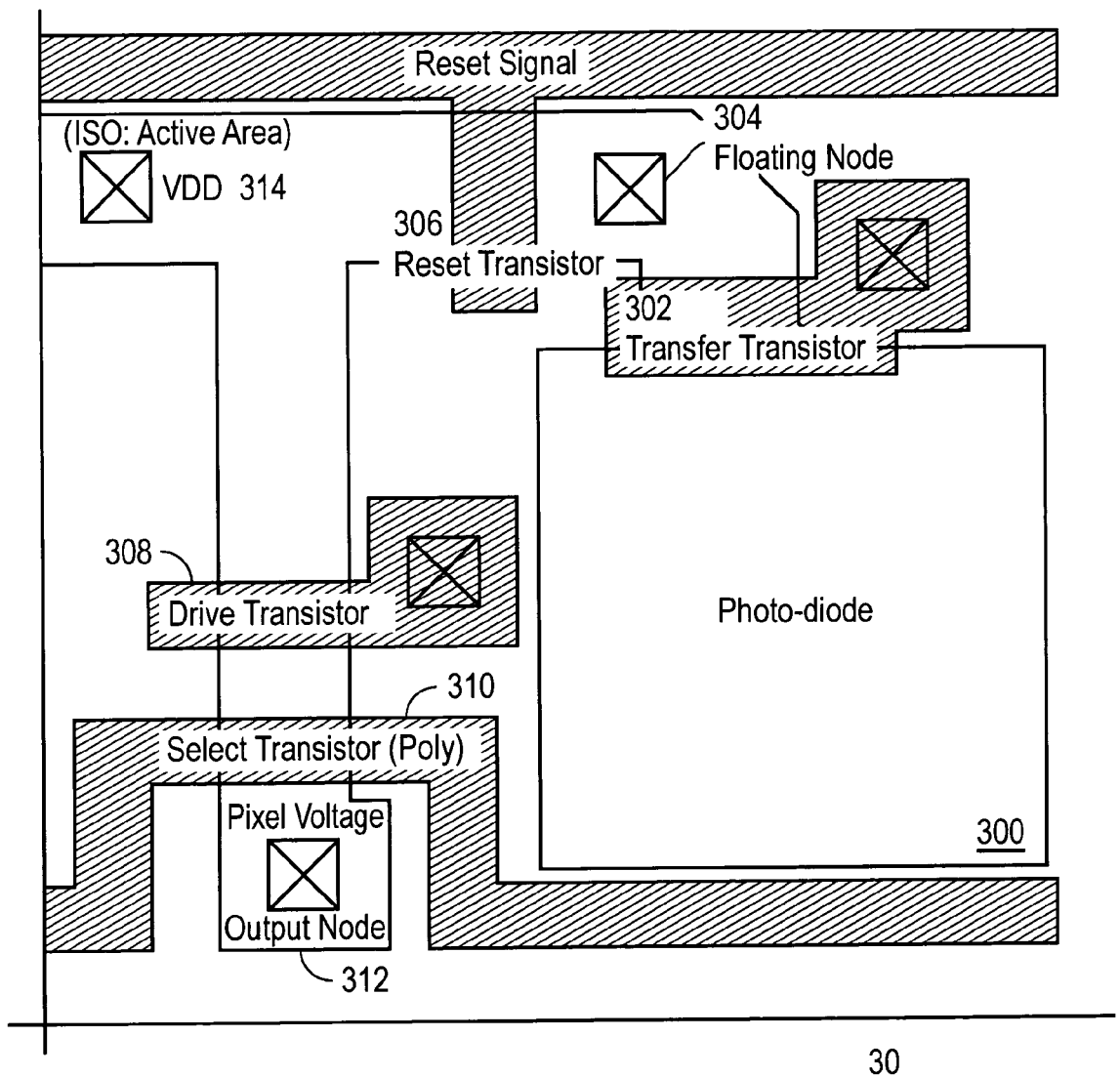
FIG. 3 is a layout view of a unit pixel for a CMOS image sensor according to the present invention.

Referring to FIG. 3, there is shown a layout view of a specific embodiment of a unit pixel 30 for a CMOS image sensor according to the present invention. Unit pixel 30 is comprised of a square-shaped image sensing area 300, transfer transistor 302, floating node 304, reset transistor 306, drive transistor 308, select transistor 310 and output 312. Unit pixel 30 is powered by power supply VDD 314.

Figure 1:
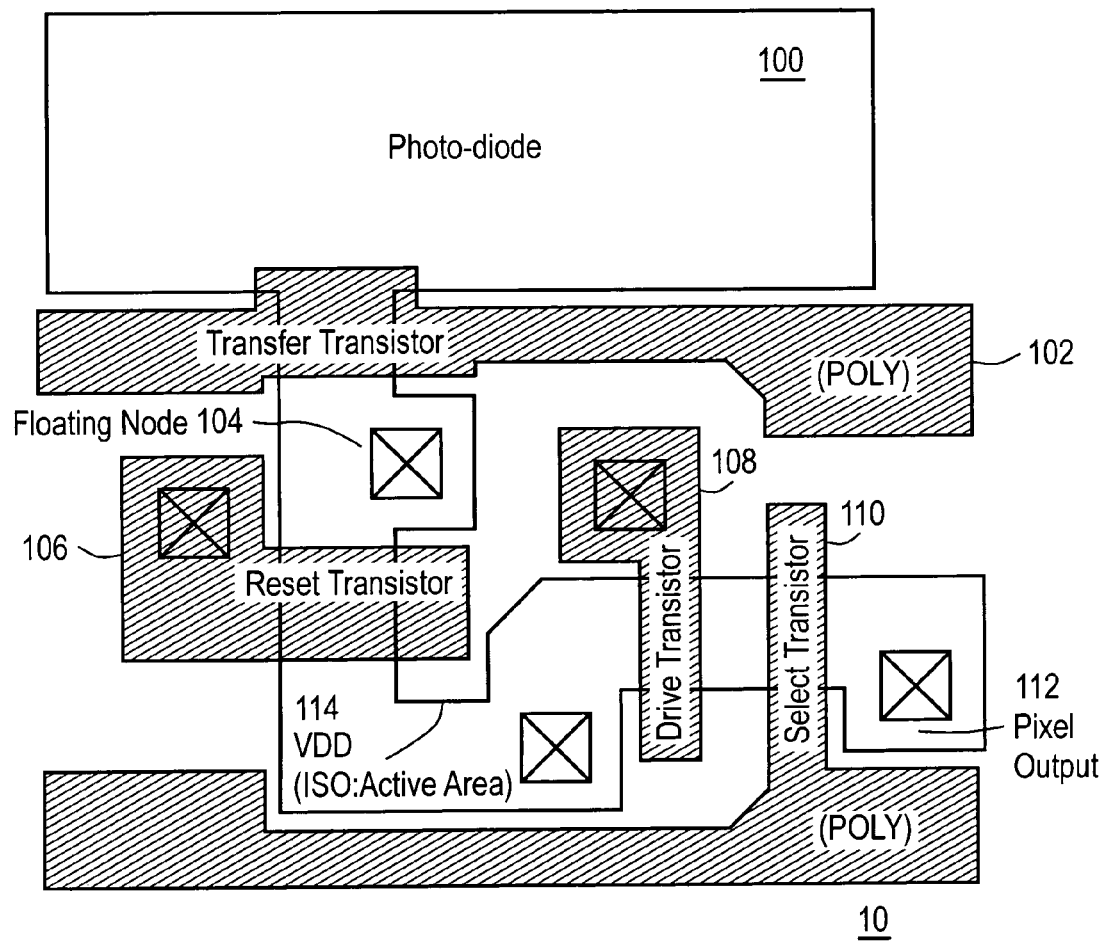
FIG. 1 is a layout view of a unit pixel for a typical CMOS image sensor.
Figure 2:
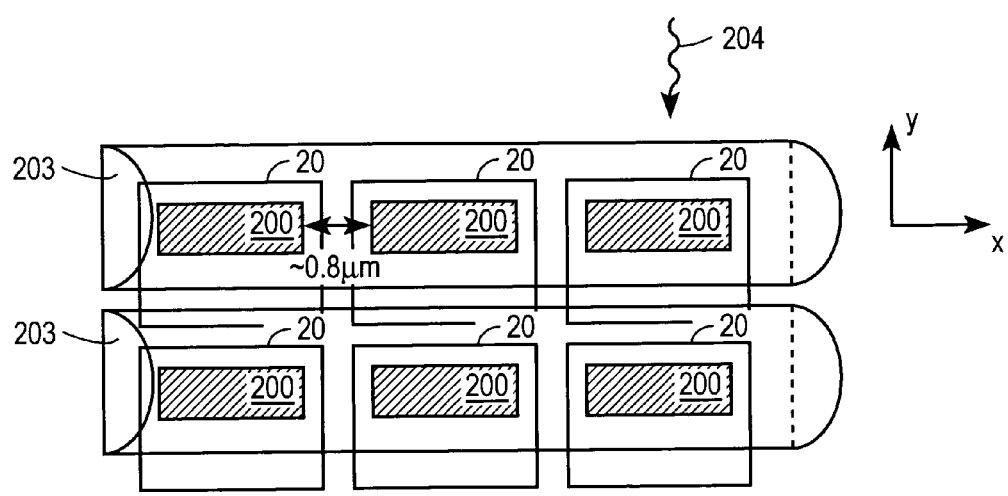
FIG. 2 is a plan view of a partial array of pixels employing hemiscylindrically-shaped microlenses over image sensing areas.

Unlike the rectangular-shaped image sensing area 100 of the unit pixel 10 for the CMOS image sensor of FIG. 1, the image sensing area 300 of the embodiment of FIG. 3, is square-shaped. And, as shown in the exemplary embodiment of FIG. 4, the image sensing areas 400 for an array 40 of unit pixels 30, have an area of, for example, about 8×8 $\mu m^2$. The spacing between neighboring image sensing areas 400 is, for example, around 4 $\mu m$, which is an improvement in separation of approximately 3.2 $\mu m$ compared to the spacing between neighboring pixels using rectangularly-shaped image sensing areas 200 of FIG. 2. It should be mentioned that the areas of image sensing area 400 and the dimension between neighboring image sensing areas 400 can be tailored to achieve a desired fill factor, desired degree of crosstalk reduction and degree of MTF improvement. Hence the dimensions provided for the embodiment in FIG. 4 should be viewed as exemplary and not absolutely limiting.

Given a common pixel area, the square-shaped image sensing area 300 of the present invention is characterized by a reduced fill factor compared to the rectangular-shaped image sensing area 100 of FIG. 1. Nevertheless, the reduced fill factor is acceptable since a greater separation between neighboring square-shaped image sensing areas 300 can be achieved in the x-direction, compared to the separation of rectangularly-shaped image sensing areas (compare FIG. 2 to FIG. 4). Hence, use of square-shaped image sensing areas 300 leads to reduced crosstalk between neighboring pixels and a higher MTF the image sensing array 40.

Figure 4:
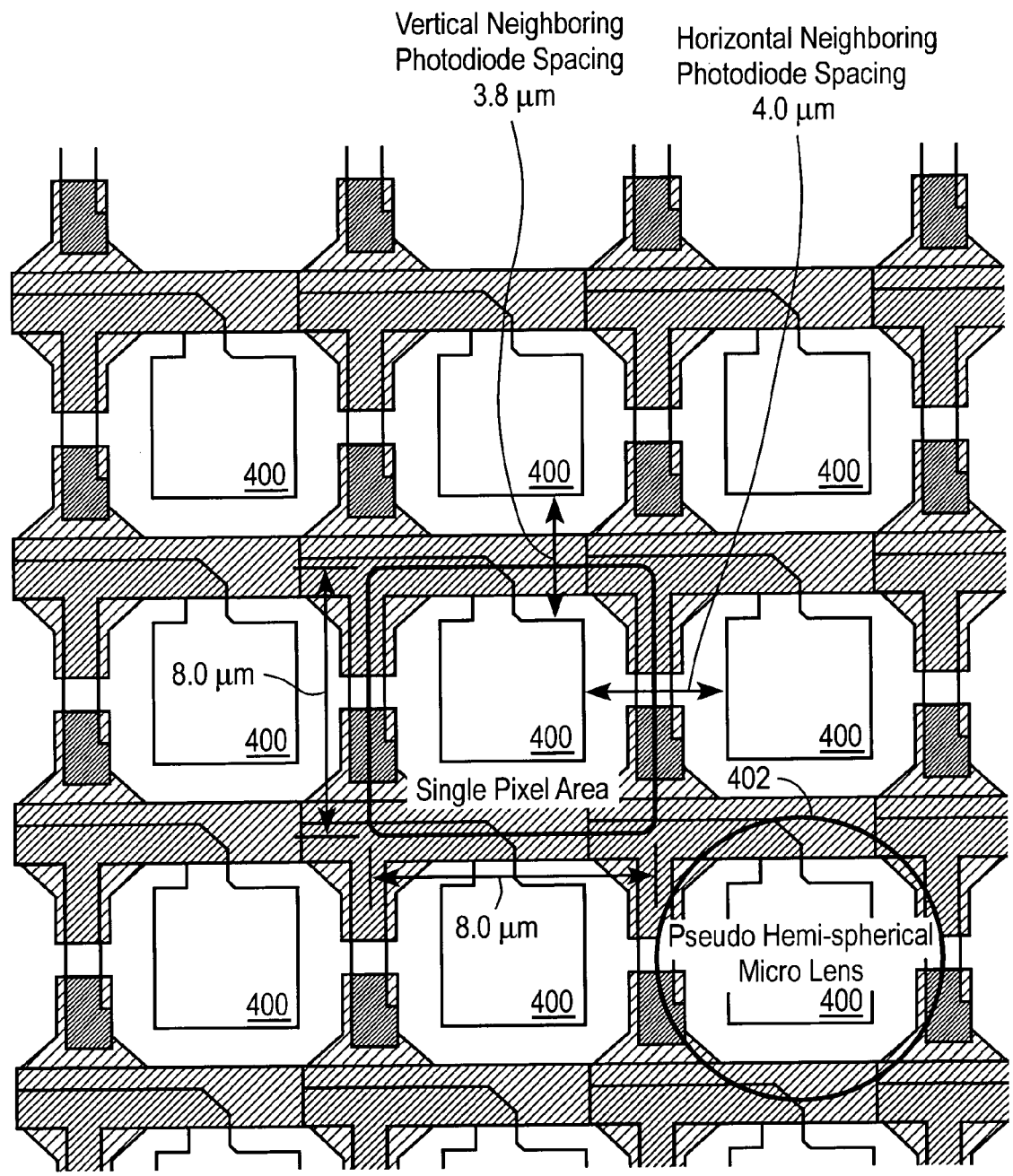
FIG. 4 is plan view of a partial array of pixels employing hemispherically-shaped microlenses over square image sensing areas according to the present invention.

Additionally, as depicted in FIG. 4, the effective fill factor of unit pixel 30 can be improved by placing hemishperically-shaped lenses 402 over the square-shaped image sensing areas 400. One added benefit of using hemispherically-shaped microlenses 402 relates to the relative ease in manufacturing the hemispherically-shaped microlenses 402, compared to odd-shaped lenses like the hemicylindrically-shaped lenses used in the embodiment illustrated in FIG. 2. Compared to the hemispherically-shaped microlenses, odd-shaped lenses often incorporate manufacturing defects and exhibit poor optical capabilities.

Figure 5:
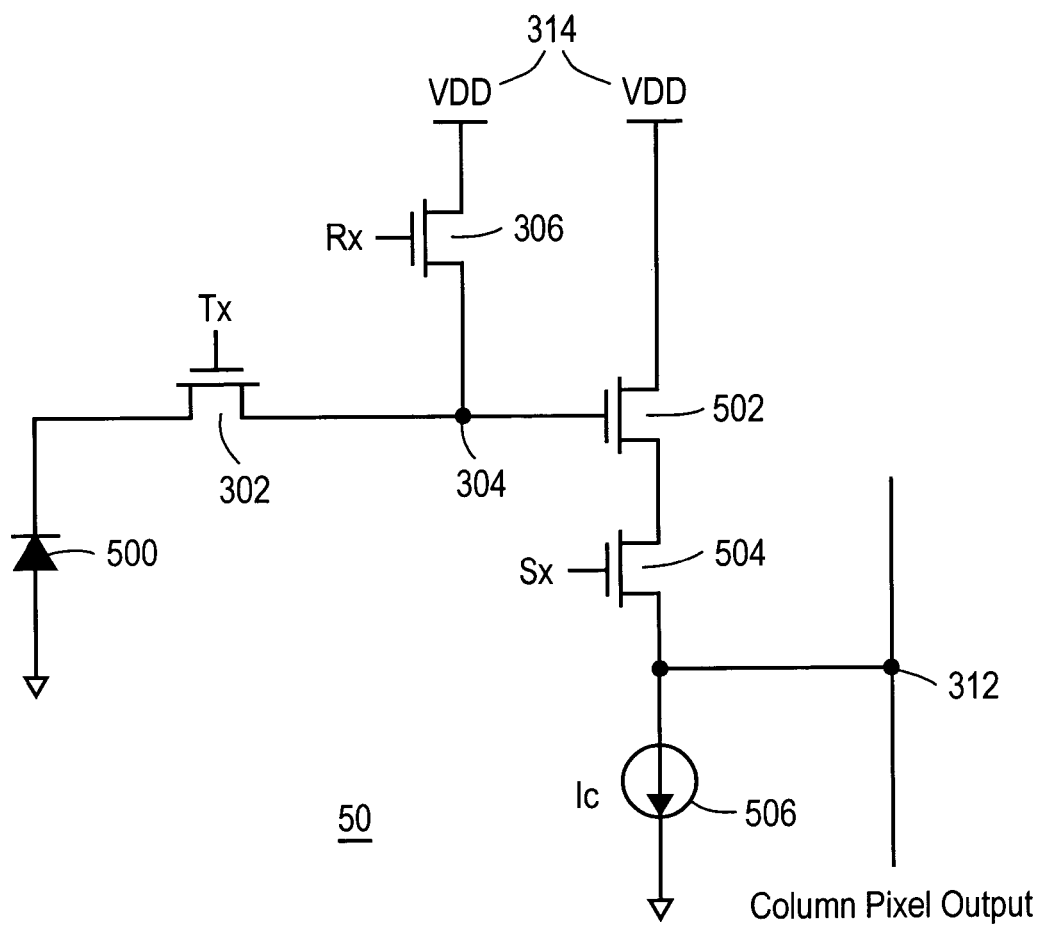
FIG. 5 is a schematic diagram of the unit pixel of FIG. 3 according to the present invention.

Referring now to FIG. 5, there is shown an equivalent circuit schematic of the unit pixel 30 of FIG. 3 in accordance with the present invention. Unless otherwise indicated, for convenience the same reference numerals identifying the components of FIG. 3 will be used to describe the operational characteristics of equivalent circuit schematic 50 of unit pixel 30.

Proper pixel operation requires three separate control signals, Tx, Rx and Sx. These control signals are further described in Woodward Yang, et al., entitled *An Integrated 800×600 CMOS Imaging System*, ISSCC Dig. Tech. Papers, 1999, pp. 304–305, which is hereby incorporated by reference. Reset transistor 306 is implemented as a depletion mode transistor in order to permit floating node 304 to be reset to VDD 314 and to reduce Vt dependence of the reset voltage. During integration time, image sensing area 300 of photodiode 500 is isolated from floating node 304 by transfer transistor 302 and floating node 304 is reset to VDD 314 through reset transistor 306. After reset, reset transistor 306 is switched off to isolate floating node 304 and the initial floating node voltage of pixel 30 (reference count) is read. After completion of the integration period, transfer transistor 302 is toggled by control signal, Tx, which causes the transfer of collected electrons from photodiode 500 to floating node 304. Finally, the resulting change in voltage at floating node 304 (raw data count) is read. Transistors 502 and 504 function together as a source follower and current source 506 functions as a load.

In conclusion, the present invention provides a novel CMOS image sensor topology, characterized by low electrical and color crosstalk between adjacent pixels and higher MTF. While the above is a complete description of the preferred embodiment of the present invention, it is possible to use various alternatives, modifications and equivalents. Therefore, the scope of the present invention should be determined not with reference to the above description, but should, instead, be determined with reference to the appended claims, along with their full scope of equivalents.

What is claimed is:

1. An array comprising:
   a plurality of CMOS pixels, each CMOS pixel comprising:
   a substantially square image sensing region, wherein a distance between the image sensing regions of neighboring pixels is optimized to reduce crosstalk between the neighboring pixels and the distance is at least 3.8 micrometers along a first axis and at least 4 micrometers along a second axis; and
   a substantially hemispherical microlens positioned over the image sensing region of each pixel.

2. The array of pixels of claim 1, wherein the distance is further optimized to improve MTF.

3. The array of claim 1, wherein the first axis and the second axis are perpendicular.

4. The array of claim 1, wherein sides of each CMOS pixel are about 8 micrometers.

5. An improved CMOS imaging array having a plurality of pixels for use in a CMOS imaging system, the improvement of each pixel comprising:
   a substantially square image sensing region configured to increase the distance between the image sensing regions of neighboring pixels, wherein the distance is at least 3.8 micrometers along a first axis and at least 4 micrometers along a second axis; and
   a substantially hemispherical microlens positioned over the image sensing region.

6. The CMOS imaging array of claim 5, wherein the position of the substantially hemispherical microlens is configured to increase an effective fill factor.

7. The CMOS imaging array of claim 6, wherein the improvement of each pixel further comprises:
   a. a transfer transistor having a drain coupled to the cathode of the photodiode, a gate controlled by a control signal, Tx, and a source coupled to a floating sensing node;
   b. a reset transistor having a drain coupled to a reset potential, a gate controlled by a control signal, Rx, and a source coupled to the floating sensing node; and
   c. a source follower coupled between the floating sensing node and an output of the unit pixel, the source follower controlled by a select signal.

8. The CMOS imaging array of claim 7, wherein the transfer transistor, the reset transistor, and the source follower are positioned along at least two sides of the pixel.

9. The CMOS imaging array of claim 7, wherein the reset transistor is a depletion mode transistor.

* * * * *